(12) United States Patent
Wright

(10) Patent No.: US 10,985,594 B2
(45) Date of Patent: Apr. 20, 2021

(54) BATTERY WITH ELECTRONIC COMPARTMENT

(71) Applicant: MONTEREY RESEARCH, LLC, Santa Clara, CA (US)

(72) Inventor: David G. Wright, Woodinville, WA (US)

(73) Assignee: MONTEREY RESEARCH, LLC, Santa Clara, CA (US)

( * ) Notice: Subject to any disclaimer, the term of this patent is extended or adjusted under 35 U.S.C. 154(b) by 0 days.

(21) Appl. No.: 16/812,842

(22) Filed: Mar. 9, 2020

(65) Prior Publication Data
US 2020/0280215 A1 Sep. 3, 2020

Related U.S. Application Data

(63) Continuation of application No. 15/700,286, filed on Sep. 11, 2017, now Pat. No. 10,587,144, which is a
(Continued)

(51) Int. Cl.
| | |
|---|---|
| *H02J 7/00* | (2006.01) |
| *H02J 7/02* | (2016.01) |
| *H02J 50/80* | (2016.01) |
| *H02J 50/23* | (2016.01) |
| *H02J 50/12* | (2016.01) |
| *G01R 31/382* | (2019.01) |
| *G08C 17/02* | (2006.01) |
| *G08C 23/04* | (2006.01) |
| *H02J 50/30* | (2016.01) |

(Continued)

(52) U.S. Cl.
CPC ............ *H02J 7/025* (2013.01); *G01R 31/382* (2019.01); *G08C 17/02* (2013.01); *G08C 23/04* (2013.01); *H02J 7/00* (2013.01); *H02J 50/12* (2016.02); *H02J 50/23* (2016.02); *H02J 50/80* (2016.02); *G08B 21/025* (2013.01); *G08B 21/0219* (2013.01); *H01M 2/1022* (2013.01); *H01M 10/482* (2013.01); *H02J 7/00034* (2020.01); *H02J 50/30* (2016.02)

(58) Field of Classification Search
CPC ...... H02J 7/0052; H02J 7/00034; H02J 50/23; H02J 50/30
USPC .... 320/107, 108, 110, 115; 429/96, 98, 100; 307/66
See application file for complete search history.

(56) References Cited

U.S. PATENT DOCUMENTS

| | | | |
|---|---|---|---|
| 4,686,998 A | 8/1987 | Robbins | |
| 5,246,790 A * | 9/1993 | Mooney | .............. H01M 2/1055 |
| | | | 429/7 |

(Continued)

*Primary Examiner* — Edward Tso
*Assistant Examiner* — Aaron Piggush
(74) *Attorney, Agent, or Firm* — Kunzler Bean & Adamson; Michael L. Bartholomew

(57) ABSTRACT

An electronic module includes wireless data transmission circuitry configured to receive from a base station a signal corresponding uniquely to a battery device, wireless charging circuitry coupled with the wireless data transmission circuitry and configured to receive energy wirelessly transmitted from the base station, and a controller configured to, in response to the wireless data transmission circuitry receiving the signal, cause the wireless charging circuitry to charge a battery module of the battery device corresponding to the signal using the received wirelessly transmitted energy.

20 Claims, 19 Drawing Sheets

Related U.S. Application Data continuation of application No. 14/529,707, filed on Oct. 31, 2014, now Pat. No. 9,774,210, which is a continuation of application No. 13/676,016, filed on Nov. 13, 2012, now abandoned, which is a continuation of application No. 12/770,601, filed on Apr. 29, 2010, now Pat. No. 8,310,201, which is a continuation-in-part of application No. 12/118,622, filed on May 9, 2008, now Pat. No. 8,093,864, which is a continuation of application No. 10/839,822, filed on May 5, 2004, now Pat. No. 7,388,350.

(60) Provisional application No. 60/468,541, filed on May 6, 2003.

(51) Int. Cl.
*H01M 10/48* (2006.01)
*H01M 2/10* (2006.01)
*G08B 21/02* (2006.01)

(56) References Cited

U.S. PATENT DOCUMENTS

| | | |
|---|---|---|
| 5,808,551 A | 9/1998 | Yarnall, Jr. et al. |
| 5,841,352 A | 11/1998 | Prakash |
| 5,874,723 A | 2/1999 | Hasegawa et al. |
| 5,963,012 A | 10/1999 | Garcia et al. |
| 6,184,656 B1 | 2/2001 | Karunasiri et al. |
| 6,208,115 B1 | 3/2001 | Binder |
| 6,400,480 B1 * | 6/2002 | Thomas .............. G08C 17/02 398/106 |
| 6,407,779 B1 | 6/2002 | Herz |
| 6,441,747 B1 | 8/2002 | Khair et al. |
| 6,661,197 B2 | 12/2003 | Zink et al. |
| 6,747,556 B2 | 6/2004 | Medema et al. |
| 6,943,666 B2 | 9/2005 | Mooney et al. |
| 6,993,356 B2 | 1/2006 | Herzinger |
| 7,002,265 B2 | 2/2006 | Potega |
| 7,388,350 B1 | 6/2008 | Wright |
| 8,093,864 B2 | 1/2012 | Wright |
| 8,310,201 B1 * | 11/2012 | Wright .............. G08B 21/025 320/108 |
| 10,587,144 B2 * | 3/2020 | Wright ................ H02J 7/025 |
| 2003/0102842 A1 | 6/2003 | Tamai et al. |
| 2003/0103088 A1 | 6/2003 | Dresti et al. |

* cited by examiner

US 10,985,594 B2

BATTERY WITH ELECTRONIC COMPARTMENT

CROSS REFERENCE TO RELATED APPLICATIONS

The present application is a continuation of U.S. patent application Ser. No. 15/700,286, filed Sep. 11, 2017, is a continuation of U.S. patent application Ser. No. 14/529,707, filed Oct. 31, 2014, now U.S. Pat. No. 9,774,210, issued on Sep. 26, 2017, which is a continuation of U.S. patent application Ser. No. 13/676,016, filed Nov. 13, 2012, which is a continuation of U.S. patent application Ser. No. 12/770,601, filed Apr. 29, 2010, now U.S. Pat. No. 8,310,201, issued on Nov. 13, 2012, which is a continuation-in-part of U.S. patent application Ser. No. 12/118,622, filed on May 9, 2008, now U.S. Pat. No. 8,093,864, issued on Jan. 10, 2012, which is a continuation of U.S. patent application Ser. No. 10/839,822, filed on May 5, 2004, now U.S. Pat. No. 7,388,350, issued on Jun. 17, 2008, which claims priority to U.S. Provisional Patent Application No. 60/468,541, filed on May 6, 2003, all of which are herein incorporated herein by reference in their entirety.

TECHNICAL FIELD

The present invention relates generally to electronic circuitry and more particularly to wireless control devices powered with batteries.

BACKGROUND OF THE INVENTION

As the cost and physical form factor of radio-frequency (RF) components and subsystems has fallen, and integration and available bandwidth has risen, many new applications of wireless technology have become practical and/or commercially viable. In many cases, this trend results in the viability of adding wireless functionality to existing products to either add features or overcome limitations of the device. In other cases, the availability of small, integrated, low cost RF devices and modules make viable accessories which improve or overcome some limitation of existing products.

One example of this is an article locator. The article locator is a small wireless device attached to an article which a forgetful owner may frequently misplace, such as a TV remote control, car keys, cell phone, MP3 players, audio equipment, Personal Digital Assistant (PDA), or any other type of battery operated device. Typically, a number of location devices are sold with a base station. Pressing a button on the base station causes the base station to transmit a signal to the wireless article locator. The article locator upon receiving the signal from the base station emits an audible, visual or vibratory alarm enabling the user to locate the article attached to the wireless device.

Adding new and possibly unrelated functionality to commonly used articles creates numerous obstacles. Accessories, such as the article locator, usually add to the physical form factor of the attached article. The physical form factor refers to the conventional physical outside appearance and shape of an article. Changing the physical form factor generally requires the user to accept a penalty in exchange for the utility of the wireless feature.

For example, a remote control device may be ergonomically designed to be evenly balanced and to be comfortably held in the hand of an operator. The operator can point the remote control device and press the buttons on the remote control device at the same time.

Attaching a wireless locator device to the top or bottom of the remote control device disrupts these ergonomic characteristics, including disrupting any balancing aspects of the remote, the way the remote may rest on a coffee table or on top of a television, and the way that the remote is normally operated. For example, it may not be possible for the operator to hold the remote and press the buttons at the same time with the same hand, since the wireless device may obstruct certain movements of the fingers on the top of a remote control key pad. Integrating wireless functionality inside a device at the factory burdens all manufactured devices with the cost of the additional functionality, which may only be used by a fraction of the purchasers.

It is often either cumbersome or impossible to add the desired functionality to an existing device, particularly if no external data interface is provided. For example, it would be advantageous to be able to convert a typical Infra-Red (IR) television (TV) remote control to use Radio Frequency (RF) signals in order to remove the need for line-of-sight between the remote control and the TV. Various accessories have been marketed implementing this function, but they have not been particularly successful because of the difficulty of attaching a universal external IR receiver to the multiplicity of different remote control form factors.

In addition, most batteries have certain disadvantages. It is not generally possible for a user to determine battery life. It is also not possible to turn a battery off other than by removing the battery from the device it is powering.

SUMMARY OF THE INVENTION

An Electronic Containment (EC) battery includes a battery section and an electronic section that together form a standard battery form factor that allows insertion into conventional electronic devices. In one example, the electronic section can include Radio Frequency (RF) circuitry that enables electronic operations in the electronic containment battery to be communicated or controlled wirelessly. In another example, the electronic section can include wireless charging circuitry that enables the battery section to be wirelessly charged while the EC battery is inserted into the conventional electronic device. In yet another example, the electronic section can include the RF circuitry and the wireless charging circuitry.

DETAILED DESCRIPTION

An Electronic Containment (EC) battery has a standard battery form factor and contains both a battery section holding a Direct Current (DC) battery and a separate electronic section for providing electronic functionality such as a wireless capability. The EC battery allows electronic features, such as wireless operations, to be added to existing battery operated devices without impacting the physical form factor of the device.

Batteries come in many form factors, but the majority of batteries use standard form factors, such as AAA, AA, 9V, C, D cells and watch batteries. A variety of battery technologies, including both one-time use and rechargeable, are available for each of these common battery form factors. The power density of these various battery technologies varies. It is generally possible to provide adequate power density in a smaller form factor than a particular battery-powered device needs, simply by using a marginally more expensive battery technology.

For example, many TV remote controls use AAA or AA battery cells and achieve months or years of life even when using the lowest power density and lowest cost batteries. It is therefore possible to use less space in a standard battery form factor by using a higher quality battery technology. For example, the EC battery can use a smaller alkaline, Nickel Cadmium (NiCad), or Nickel-Metal Hydride (NiMH) battery technology to provide the same power storage capability as a standard battery in a smaller space. The additional space made available in the standard battery form factor is then used for providing additional electronic or other wireless functions.

Figure 1:
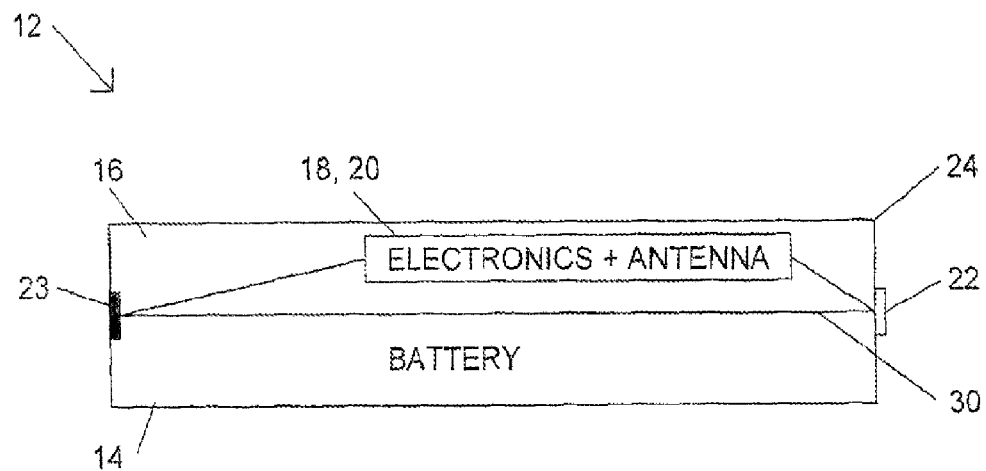
FIG. 1 is a first embodiment of an Electronic Containment (EC) battery.
Figure 2:
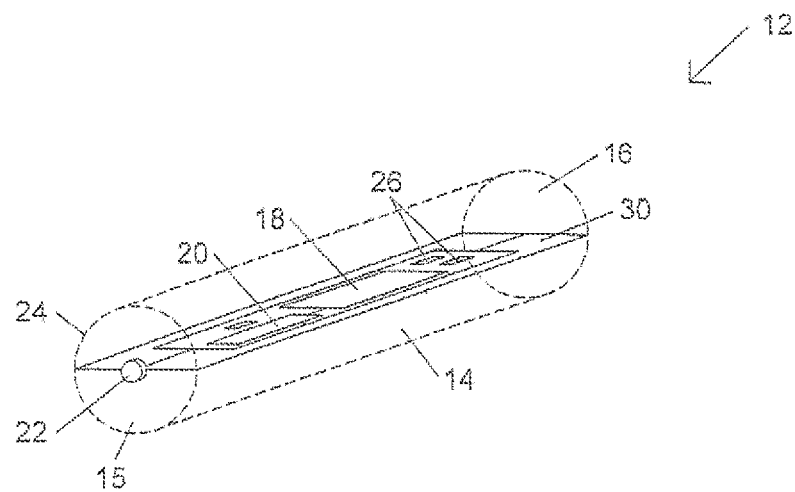
FIG. 2 is a perspective view of the EC battery shown in FIG. 1 with the outside container shown with phantom lines.

Some of the many possible physical partitions of power storage and electronics within a standard battery form factor are shown in FIGS. 1-7. Other configurations or partitions are also possible for any other conventional battery form factor. FIGS. 1 and 2 show a first embodiment of the Electronic Containment (EC) battery 12 that includes a battery section 14 and an electronic section 16 and maintains a standard AAA, AA, C or D battery form factor.

In one exemplary embodiment, the battery section 14 may comprise an alkaline, NiCad, or NiMH battery technology or other battery technology that uses less space than cheaper battery materials. The electronic section 16, in one example, contains Radio Frequency (RF) circuitry 18 and an antenna 20. Both the electronic section 16 section and the battery section 14 may be coupled to a positive terminal 22 and a negative terminal 23 of the EC battery 12. Additional current and/or voltage sensing circuitry 26 may also be contained in the electronic section 16.

In one embodiment, all the electronics in the electronic section 16 are implemented in a single Integrated Circuit (IC) or a small circuit board. The battery section 14 and the electronic section 16 each comprise a semi-cylindrical longitudinal half of the EC battery 12. A wall 30 separates the electronic section 16 from the battery section 14. Both the battery section 14 and the electronic section 16 may be formed out of the same metal, paper, etc. that normally forms the outside container of a conventional battery. In another embodiment, the battery section 14 and the electronic section 16 are formed out of plastic or any other semi-rigid or rigid material.

The outside container for the EC battery 12 shown in FIGS. 1 and 2 may be a single continuous piece of material that permanently holds the battery section 14 and the electronic unit 16 together. In this arrangement, the battery material in battery section 14 may be rechargeable. The electronics in the electronic section 16 may then include circuitry that prevents damage when the battery section 14 is being recharged.

Figure 3:
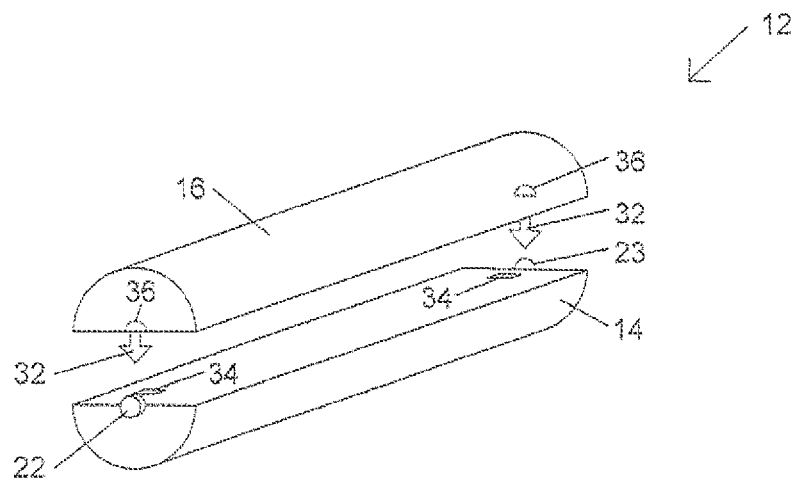
FIG. 3 is another embodiment of the EC battery shown in FIG. 1 with a detachable battery section.

FIG. 3 shows another embodiment of the EC battery 12 that provides a detachable battery section 14 and electronic section 16. This configuration allows either disposable or rechargeable battery materials to be used in battery section 14. Replacement battery sections 14 could then could be interchanged with the electronic section 16. The battery section 14 is formed into a separate container with a substantially half semi-cylinder shape. The electronic section 16 similarly is a separate container having a substantially half semi-cylinder shape. The two sections 14 and 16 can be formed out of any material typically used to contain a battery or alternatively could be made out of other material such as plastic.

In one example, the battery section 14 includes two receptor slots 34 that receive mating connectors 32. In one embodiment, the connectors 32 and receptor slots 34 are formed of conductive material. The connectors 32 are coupled to the electronic circuitry in the electronic section 16 and the receptor slots 34 are coupled to the positive terminal 22 and negative terminal 23 of the battery section 14. Inserting the connectors 32 into the receptor slots 34 couple the electronics 18, 20 and 26 (FIG. 2) to the positive terminal 22 and the negative terminal 23.

In another embodiment, the connectors 32 and the receptor slots 34 only provide mechanical attachment of the battery section 14 with the electronic section 16. In this embodiment, contacts 36 on opposite ends of the electronic section 16 provide electrical coupling with the positive terminal 22 and negative terminal 23 of the battery section 14 when the two sections 14 and 16 are fully attached together. Other mechanical and electrical coupling techniques are also possible.

Figure 4:
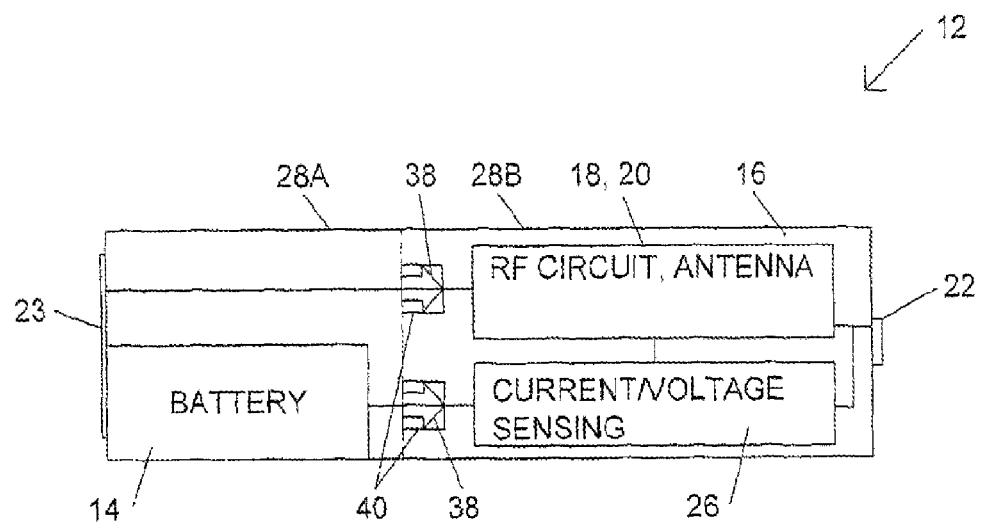
FIG. 4 shows another configuration of the EC battery.

FIG. 4 shows another embodiment where the battery section 14 and the electronic section 16 take up different portions of the EC battery 12. In this example, the battery section 14, similar to the battery section 14 shown in FIGS. 1-3, may comprise a NiMH or other type of battery technology that uses less space than a conventional battery form factor. The extra space in the EC battery 12 is used by the electronic section 16 to hold RF circuitry 18, antenna 20 and current and/or voltage sensing circuitry 26. Both the electronic section 16 and the battery section 14 may be coupled to both the positive terminal 22 and the negative terminal 23 of the EC battery 12.

In one mechanical embodiment the battery section 14 and the electronic section 16 are formed into a unitary single package with a conventional battery form factor. In another embodiment, the battery section 14 and electronic section 16 are contained in separate container pieces 28A and 28B that are both electrically and mechanically connected together possibly using connectors 38 and associated contact slots 40 similar to the connectors 32 and contact slots 34 previously shown in FIG. 3. In this embodiment, the two separate container pieces 28A and 28B have circular shapes that connect along substantially a vertical center axis of the EC battery 12 as opposed to being semi-circular shapes that connect along a horizontal center axis of EC battery 12 as shown in FIG. 3.

Figure 5:
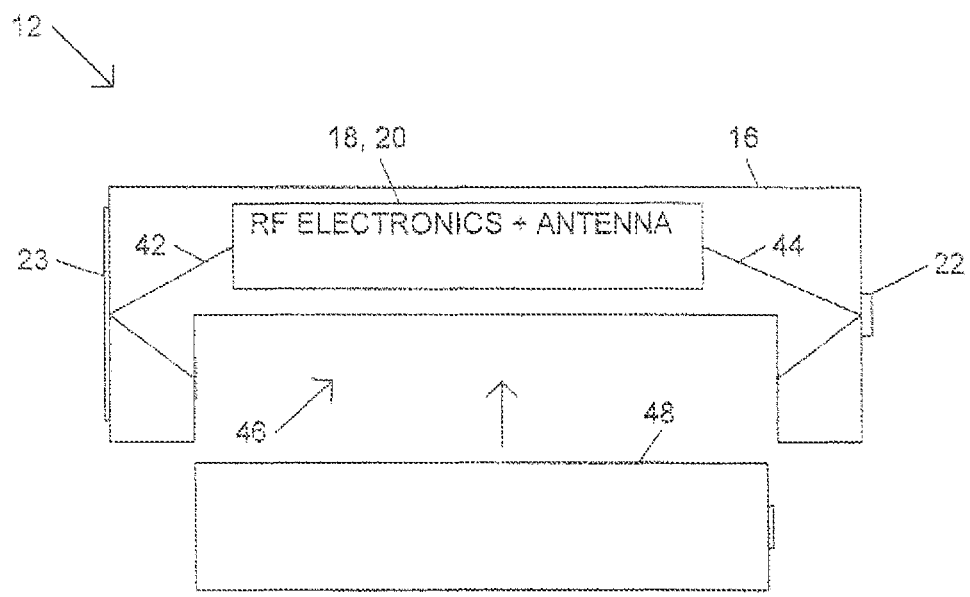
FIG. 5 is another embodiment of an EC battery having a first standard battery form factor that receives a second smaller standard battery form factor.
Figure 6:
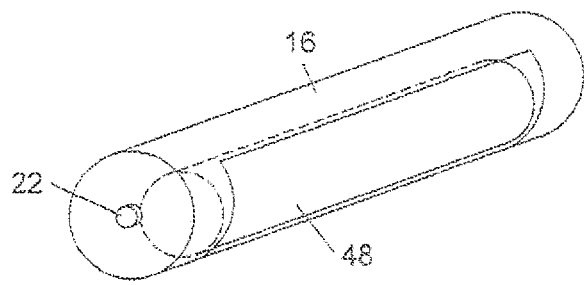
FIG. 6 is a perspective view of the EC battery shown in FIG. 5.

FIGS. 5 and 6 show another example of an EC battery 12 having the form factor of a standard battery but mechanically arranged to accept a battery 48 having a smaller standard battery form factor. The EC battery 12 includes an electronic section 16 that holds the RF circuitry 18, antenna 20 or any other circuitry or electronic function that may be desired to be implemented. The electronic section 16 includes a slot 46 that slidingly receives a conventional battery 48. When the battery 48 is inserted into the slot 46, the form factor of the EC battery 12 is the same as a standard battery. For example, the EC battery 12 may have the form factor of a standard AA, C, or D battery. The slot 48 however is configured to receive a AAA, AA or watch battery 48 or any other type of convention battery that is small enough to fit inside the standard battery form factor of the EC battery 12. Other battery form factors could also be used, including camera flash batteries with a 9 Volt (V) form factor or other battery form factors not specifically listed above.

Figure 7:
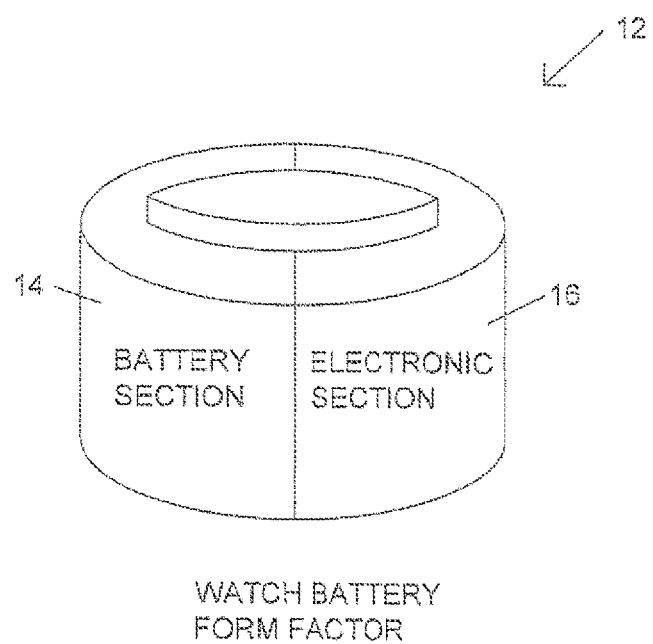
FIG. 7 is another embodiment of the EC battery incorporated into a standard watch battery form factor.

FIG. 7 shows another embodiment of the EC battery 12 that has the form factor of a conventional watch battery. The battery section 14 contains a battery material conventionally used for watch batteries such as a micro alkaline or silver oxide material. The electronic section 16 contains any of the electronics described above in FIGS. 1-6 or may contain other electronics not mentioned.

APPLICATIONS

Battery Level Indicator

Figure 8:
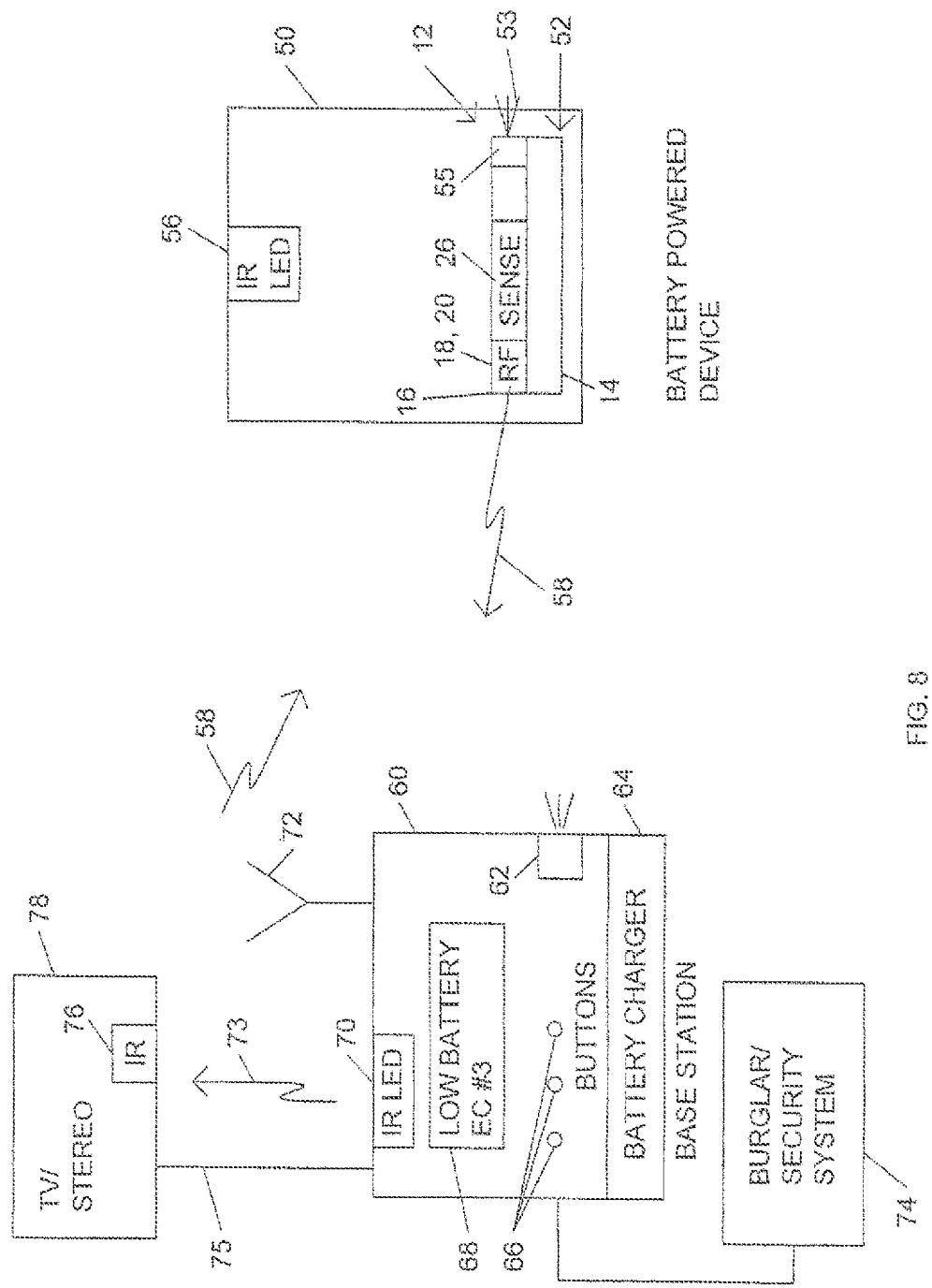
FIG. 8 is a diagram showing an electronic device and a base station using the EC battery.

FIG. 8 shows the EC battery 12 inserted into slot 52 of a battery powered device 50. The battery powered device 50 can be any electrical device that receives a conventional battery having a standard battery form factor. Some examples of battery powered devices include, key faubs, television and stereo remote controls, garage door remote controls, smoke alarms, cellular telephones, Personal Digital Assistants (PDAs) or any other type of battery powered device.

The EC battery 12 may include the current and/or voltage sensing circuitry 26 previously described in FIG. 4. The sensing circuitry 26 monitors the voltage or current level of the battery material in battery section 14. In one example, the EC battery 12 uses the RF circuitry 18 to then send wireless signals 58 to a base station 60 communicating the voltage or current level data monitored by the sensing circuitry 26. The sensing circuitry 26 can either continuously provide real time battery status information 58 to the base station 60 or may only send the battery status information 58 when a low charge threshold is crossed by the battery material in battery section 14.

Responsive to the battery status information 58, the base station 60 either annunciates a low battery warning through an annunciator 62, such as a speaker, or may display the battery level information on a display 68. In another embodiment, the base station 60 identifies the particular EC battery 12 that sends the battery status information 58. For example, the RF circuitry 18 in the EC battery 12 may send a serial number or other identifier in the wireless signals 58 that is used by the base station 60 to identify the specific EC battery 12 on display 68.

The current or voltage sensing circuitry 26 could also infer information about the operation of the battery powered device 50 based on the measured current or voltage of the battery section 14. For example, the sensing circuitry 26 could send a wireless signal 58 to base station 60 indicating that the battery section 14 is drawing substantially no voltage or current. The base station 60 may infer from the low power draw that the battery powered device 50 is either off or in a standby mode. If the sensing circuitry 26 indicates a voltage or current draw above some minimal amount, the base station 60 may infer that the device 50 is in an operational mode. Pursuant to receiving signal 58, the base station 60 would then indicate on display 68 that the device 50 is currently on. This would allow a user to look at the display 68 on base station 60 to determine if any electronic devices, such as battery powered device 50, should be turned off.

Smoke Alarm

Referring still to FIG. 8, another embodiment of the EC battery is used for enhancing smoke alarm functionality. In this application, the battery powered device 50 is a smoke alarm that contains the EC battery 12. In this example, the EC battery 12 may have a 9 volt battery form factor. There may be multiple smoke alarms 50 that each includes an EC battery 12. The EC batteries 12 communicate with the base station 60 which typically would be located in the kitchen within easy reach of a stove. The base station 60 provides an indication of battery life as described above. This allows the battery section 14 to be replaced or recharged before the irritating low battery indication signal begins to sound on the smoke alarm.

The EC battery 12 could also include an electronic on/off switch (see switch 90 in FIG. 10) with a failsafe state of on. If the smoke alarm 50 were activated in a non-emergency situation, such as while cooking, one of buttons 66 on the base station 60 can be pressed to temporarily disconnect the battery section 14 from the smoke alarm 50. This would turn off the smoke detector alarm for a brief period. The battery section 14 would then be automatically reconnected to the smoke alarm.

The base station 60 could also connect to a security system 74, to add central station fire alarm capability without having to install new fire sensors and wiring. In this embodiment, the sensing circuitry 26 may detect when the smoke alarm 50 is activated by detecting a particular level of current drain from battery section 14. The RF circuitry 18 accordingly sends an alarm signal 58 to the base station 60 indicating the smoke alarm 50 has been activated. The base station 60 then sends an alarm signal to the central security alarm 74.

Device Locator

Referring still to FIG. 8, the EC battery 12 can also be used as a device locator. The EC battery 12 both powers the device 50 and also serves to locate the battery powered device 50. The EC battery 12 may include an annunciation device 55, such as a speaker. The base station 60 includes one or more find buttons 66 that cause the base station 60 to send a wireless signal 58 to the RF circuitry 18 in the EC battery 12. Upon receiving the wireless signal 58, the annunciation device 55 in the electronic section 16 is activated. A user can then listen to the annunciation signal 53 output from the EC battery 12 to locate device 50. The annunciation device 55 may use the cavity of the electronic section 16 (see FIGS. 1-7) for increasing the resonance of the annunciation signal 53.

The base station 60 can include multiple buttons 66, each communicating with one of multiple different wireless EC batteries 12. The base station 60 can also include a battery charger 64 for recharging the battery sections 14 that include rechargeable battery materials.

Proximity Monitor

Referring still to FIG. 8, another application for the EC battery 12 is for use as an anti-theft or child security device. In the anti-theft application, the base station 60 may be connected to a burglar alarm 74 or other security system. The EC battery 12 and the base station 60 periodically exchange wireless signals 58. The alarm 74 is activated when the base station 60 does not receive the wireless signal 58 from the EC battery 12 for some period of time. This indicates that the device 50 has been taken beyond some threshold communication distance from the remote station 60. For example, when some is trying to steal the device 50.

Figure 9:
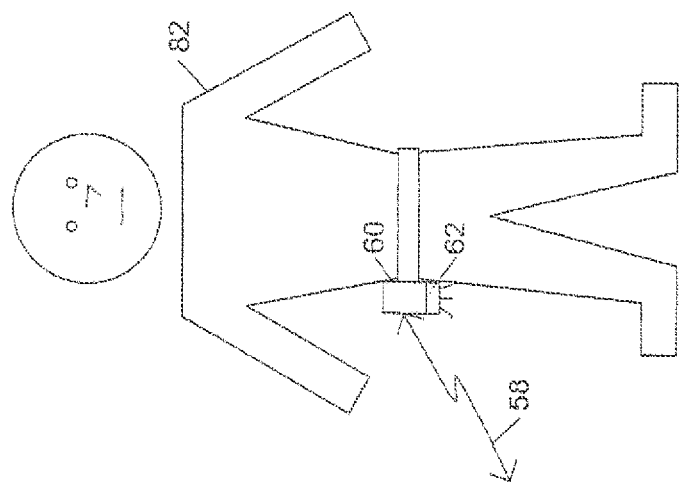
FIG. 9 is a diagram showing how the EC battery can be used as a location monitor.
Figure 9:
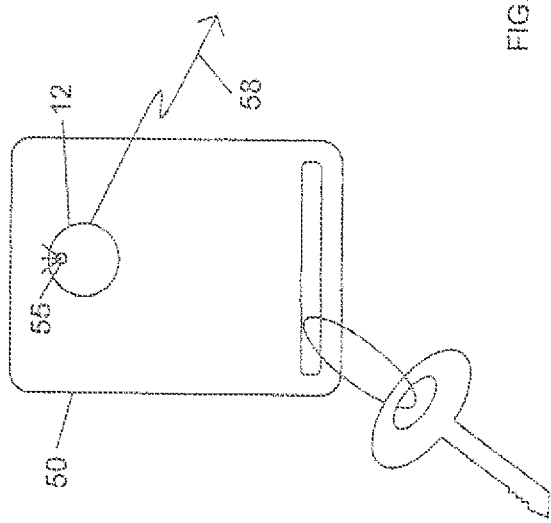

In another application, the EC battery 12 is used in a device 50, such as a pager type device with a clip, that can be attached to a child or located in a child stroller. In this application, the failure of the base station 60 to periodically receive the signal 58 from the device 50 indicates that the child carrying the device 50 has strayed beyond some preconfigured distance from the base station 60. As shown in FIG. 9, the base station 60 may be a portable device that can be carried by the child's parent.

To avoid detection, someone may try to remove the EC battery 12 from the battery powered device 50. The sensing circuitry 26 could sense a quiescent current drawn from the device 50, even when the device 50 is turned off. If the EC battery 12 is removed from the device 50, the sensing circuitry 26 detects no quiescent current draw. This causes the sensing circuitry 26 to send a wireless signal 58 to the base station 60 that causes the base station 60 to activate the alarm 74 or annunciator 62.

FIG. 9 shows another embodiment of the EC battery 12 used as a proximity monitor. The base station 60 in this example may be worn on a person 82 or carried in another clothing article commonly worn or carried by person 82. The EC battery 12 powers a battery powered device 50 that the user 82 does not wish to be separated from. For example, the battery powered device 50 in this example may be a car key faub, Personal Digital Assistant (PDA), etc. In another example, the device 50 does not even need to be inserted into a battery powered device, but may simply be placed in the article, such as a wallet or purse, that the person 82 does not wish to forget.

The base station 60 and the EC battery 12 periodically (for example every minute) exchange brief wireless signals 58, confirming that they are within some predefined range. If the base station 60 and the EC battery 12 became separated beyond some threshold distance or were unable to successfully exchange the wireless signals 58, the annunciator 62 in the base station 60 or the annunciator 55 in the EC battery 12, or both, are activated. Thus, the EC battery 12 prevents someone from leaving behind the battery powered device 50, such as the PDA or key faub.

Figure 10:
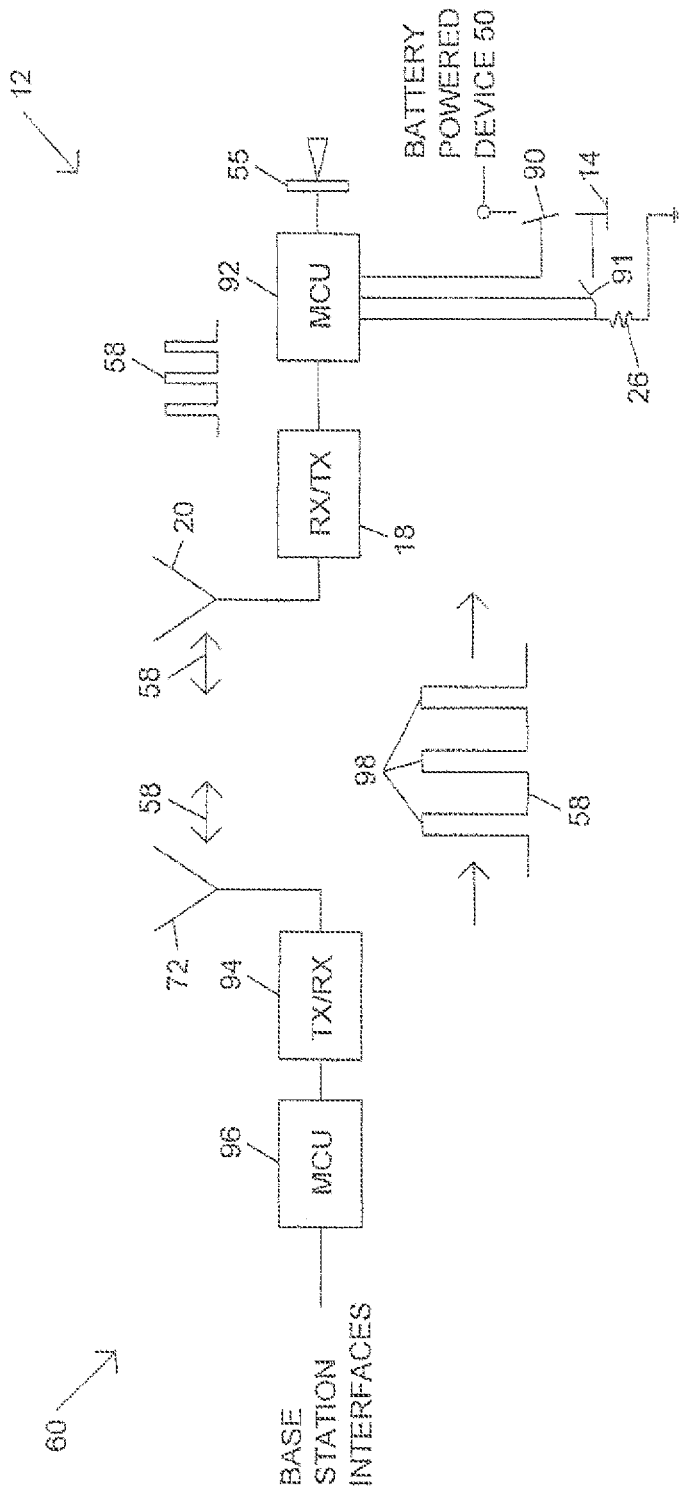
FIG. 10 is a circuit diagram showing some of the circuitry in the base station and EC battery.

FIG. 10 shows one example of circuitry in the EC battery 12 and in the base station 60 used for providing the battery charge sensing, device locating, or proximity monitoring functions described above. For battery level detection the sensing circuitry 26 in the EC battery 12 may include a resistor or any other electrical components used for monitoring a voltage or current level for the battery section 14. A Micro-Controller Unit (MCU) 92 may periodically activate a switch 91 that enables a measurement of the voltage or current for the battery in battery section 14. If the voltage or current measurement from sensing circuitry 26 drops below some threshold value, the MCU 92 activates an RF transmitter in the RF circuitry 18 that transmits a signal 58 to the base station 60.

A MCU 96 in the base station 60 receives signal 58 and generates a signal to an interface device, such as the annunciator 62 or the display 68 (FIGS. 8 and 9). In an alternative embodiment, the MCU 96 in the base station 60 transmits a signal 58 to the EC battery 12 that causes the MCU 92 to take a measurement for battery section 14. The MCU 92 reports the measurement value over wireless signal 58 back to the base station 60. The battery charge query signal 58 transmitted by the base station 60 may be initiated automatically by the MCU 96 or may be initiated manually by a user pressing one of buttons 66 (FIG. 8).

For the device locator application, the EC battery 12 includes the annunciation device 55 that is activated when one of the buttons 66 (FIG. 8) in the base station signal 60 is pressed. In this application, the MCU 96 or some other type of signal generator in the base station 60 generates one or more signals 58 that are output from an RF transmitter in base station RF circuitry 94. The RF circuitry 18 in the EC battery 12 includes an RF receiver that receives the signals 58 via antenna 20. The MCU 92, or some other type control circuitry, activates the annunciator 55 whenever the wireless signal 58 is detected from the base station 60.

In another embodiment where the EC battery 12 is used as a device locator or as a proximity monitor, the RF circuitry 18 in the EC battery 12 may include RF transceiver circuitry that bounces back signal 58 sent from the base station 60 back to the base station 60. This allows the MCU 96 in the base station 60 to measure a propagation delay for the signal 58 sent to and then received back from the EC battery 12.

For example, the MCU 96 may include a counter function that counts the number of pulses 98 in signal 58 that are received over some period of time. The number of counted pulses is proportional to the propagation delay of the signal 58. Alternatively, the MCU 96 may count the amount of time required for each pulse 98 in signal 58 to be sent and then received back from the EC battery 12. The base station 60 determines the distance of the device 50 from the base station 60 according to measured propagation delay. Calculating a propagation delay of a wireless signal is known to those skilled in the art and is therefore not described in further detail.

The calculated distance between the base station 60 and the device 50 is then used for any of the device locator or proximity detection applications described above. For example, for the device locator application, the distance of the device 50 from base station 60 can be output in text form from the display 68 (FIG. 8) on the basic station 60 or a tone can be generated from annunciator 62 on the basic station 60 that varies according to the distance of device 50 (FIG. 8) from the base station 60.

For example, a high pitched tone could be generated when the device 50 is relatively close to the base station 60. A lower pitched tone could be generated by the base station 60 when the device 50 is a farther distance away. This could eliminate having to provide the annunciation device 55 in the EC battery 12. It is also possible to use multiple base stations 60 that triangulate signals received back from the same EC battery 12 so that a precise x-y position of the device 50 from the base station 60 could be displayed.

In the proximity monitoring application described above, the EC battery 12 is used for preventing someone from leaving the device 50 or for preventing someone from stealing the device 50. As also described above, proximity monitoring can be used to notify a parent when a child has wondered too far away from the base station 60. In these applications, the MCU 96 calculates the distance of the device 50 from the base station 60 according to the measured propagation delay of signal 58 as described above. The MCU 96 in the base station 60 compares the calculated distance to some threshold value that may be programmed into the MCU 96. If the calculated distance is greater than the threshold value, or if the wireless signal 58 is simply not returned to the base station 60, the MCU 96 activates annunciator 62 and/or the security system 74 (FIGS. 8 and 9)

On/Off Switch

Referring to FIGS. 8 and 10, switch 90 is used for the smoke alarm application described above. The switch 90 can be in a normally closed position. A user may press one of the buttons 66 (FIG. 8) on the base station 60 to disable one or more smoke alarms 50 powered by one or more of the EC batteries 12. For example, the smoke alarm 50 may activate while a user is cooking. The user presses button 66 to send signal 58 to the EC battery 12 in the smoke alarm 50. The MCU 92 in the EC battery 12 detects the signal 58 and accordingly opens switch 90 (FIG. 10) for some predetermined period of time. This temporarily disables the alarm in the smoke detector 50. After the predetermined period has passed, the MCU 92 closes switch 90 reconnecting the battery section 14 to the smoke alarm 50.

In another embodiment, the circuitry in the EC battery 12 disables the battery section 14 from powering the device 50 unless the device 50 is within some predetermined range of the base station 60. The base station 60 may periodically send the signal 58 to the EC battery 12. If the RF circuitry 18 does not receive the signal 58 from the base station 60 for some period of time, or if the propagation delay of signal 58 is greater than some threshold, the MCU 92 opens switch 90 disconnecting the battery section 14 from the battery powered device 50.

The on/off switch 90 in FIG. 10 can also be used to improve battery life. Many battery-powered devices 50 continue to drain current from attached batteries even when not in use. This continuous quiescent current drain can exhaust all the power from batteries that are left in devices 50 for an extended period. One example is wireless Human Interface Devices (HID) devices, such a keyboard, mouse, gamepad, etc, which typically draw significant current even when not being used.

In one implementation, the sensing circuitry 26 monitors the current drain from battery section 14 and sends a wireless signal 58 reporting the current drain to the base station 60. The base station 60 monitors the current drain signal 58 and detects when the device 50 is off or in a standby mode. For example, when the current drain is below some low threshold value. The base station 60 sends a message to the EC battery 12 turning off switch 90 effectively disconnecting the device 50 from battery section 14. This causes device 50 to only draw power from battery section 14 when the device 50 is in operation.

The MCU 92 in EC battery 12 can alternatively be programmed to perform any of the monitoring functions performed by the base station 60. The base station 60 can generate unique signals for different EC batteries 12. The circuitry in the EC batteries 12 would then only respond to their associated wireless signals 58. Any unique signaling technique can be used for differentiating signals sent to different EC batteries 12. For example, a serial number may be associated with each EC battery and a wireless signal 58 may include an identifier associated with the EC battery serial number. Alternatively, the RF circuitry 18 in each EC battery 12 may be associated with different frequency hopping schemes or different encoding schemes.

Infra-Red-Radio Frequency Converter

Current IR remote control devices operate on line of site. In other words, the remote control signals do not work if the IR signals from the remote control device do not point substantially at the IR receiver in the television or stereo. If the portion of the TV or stereo equipment containing the IR receiver is located in a cabinet, the IR signals may not be able to pass through the glass or other furniture containing the IR receiver.

Referring back to FIG. 8, the EC battery 12 in another embodiment operates as an Infra-Red (IR) to Radio Frequency (RF) remote control converter. In this embodiment, the battery powered device 50 is an IR-based remote control device, such as a television or stereo remote control. The current-sensing ability of the sensing circuitry 26 is used to monitor the power drawn by the IR-based remote control device 50 from the battery section 14.

The sensing circuitry 26 infers from the current draw from the battery section 14 when an IR Light Emitting Diode (LED) 56 in the remote control device 50 is on and when it was off. The sensing circuitry 26 then converts the IR data into RF signals 58 that are transmitted to the base station 60. The base station 60 receives the RF signals 56 and retransmits the data as an IR signal 73 to a TV, stereo 78, etc. using an IR LED 70. Because the RF signals 58 can be received from the EC battery 12 without having to be within line-of-site, the base station 60 can successfully receive the RF signals 58 and forward the equivalent data as IR signals 73 to the TV or stereo IR receiver 76.

The base station 60 is well positioned in some location where the IR signal 73 can be successfully received by the IR receiver 76 in the TV or stereo 78. For example, the base station 60 may be located in the same stereo cabinet containing the TV or stereo 78. In an alternative embodiment, the base station 60 is connected through a cable 75 directly to the TV or stereo 78. Electrical signals are then sent over the cable 75 that contain the remote control data received over the RF signals 58.

Figure 11:
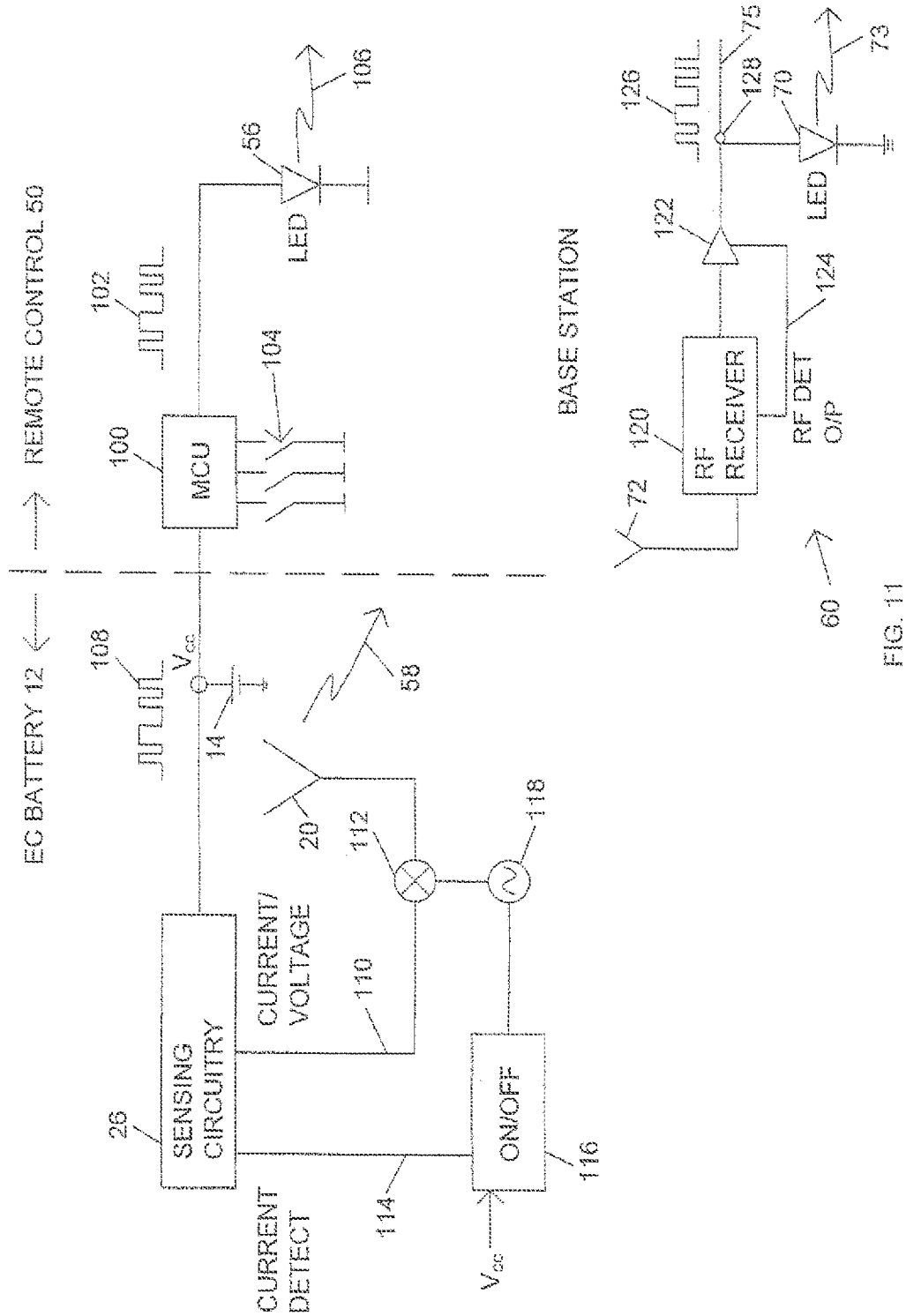
FIG. 11 is a circuit diagram showing EC battery circuitry that converts an IR remote control into an RF remote control.

FIG. 11 shows the circuitry in the EC battery 12 that provides the RF remote control converter function for an IR remote device 50. The IR remote control circuitry in the remote control device 50 includes a MCU 100. The MCU 100 generates different pulse signals 102 responsive to an operator pressing buttons 104 on the remote control device 50. The pulse signals 102 are conventionally used to activate the IR LED 56 that transmits an IR signal 106 to the IR receiver 76 in the TV, stereo or other IR controlled device 78 (FIG. 8).

The sensing circuitry 26 in the EC battery 12 monitors the current drain from the battery section 14 that rises and falls in proportion to the on and off condition generated by IR signal 102. In other words, when the pulses in signal 102 are high (on condition), the LED 56 is activated drawing current from battery section 14. In between pulses, the signal 102 is low and the LED 56 is off drawing little or no current from battery section 14.

The current signals 108 are proportional to the current drain and are sensed by the sensing circuitry 26. The sensing circuitry 26 converts the current signal 108 into a corresponding voltage signal 110 that is fed into a mixer 112. The sensing circuitry 26 also generates a current detection signal 114 that activates an on/off switch 116 whenever the current signal 108 indicates an on condition. The on/off switch 116 activates a frequency generator 118 generating a frequency signal that is mixed with the voltage signal 110 to produce the RF signal 58 that corresponds to the IR signal 102. The RF signal 58 is transmitted via antenna 20 to the base station 60.

An RF receiver 120 in the base station 60 receives the RF signal 58 via antenna 72. The RF receiver 120 outputs the RF signals to an amplifier 122 and also generates an RF detection signal 124 then turns the amplifier 122 on and off according to any detected RF signals 58. The amplifier 122 generates an output signal 126 that corresponds to the IR signal 102 generated by the MCU 100 in the IR remote control device 50. The signal 126 activates the IR LED 70 in the base station 60. The IR LED 70 is located next to the IR receiver 76 (FIG. 8) in the TV or stereo 78. Thus, the RF signal 58 is alternatively used for controlling an IR operated device. In one alternative embodiment, an output 128 from the amplifier 122 connects to the cable 75 that couples directly to an input of the TV or stereo 78.

Figure 12:
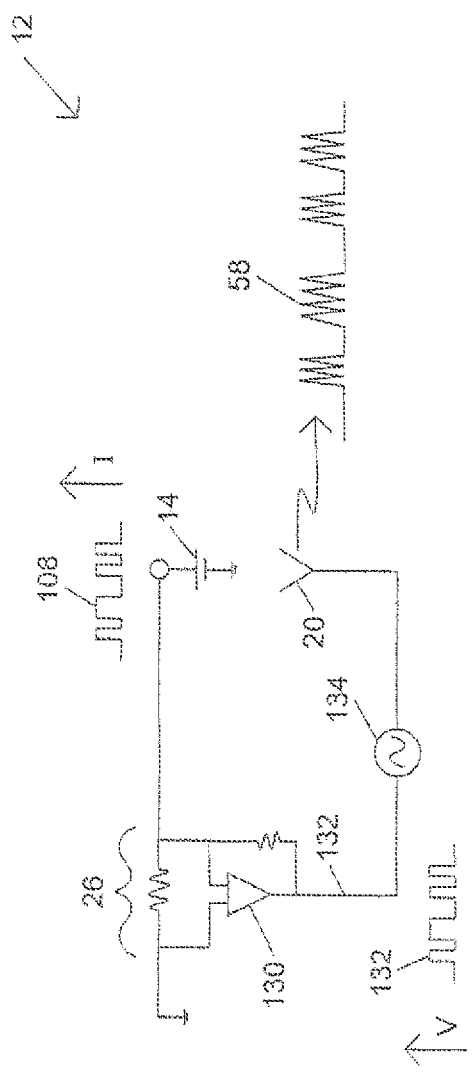
FIG. 12 is an alternative circuit for the EC battery shown in FIG. 11.

FIG. 12 shows an alternative embodiment of the sensing circuitry 26 in the EC battery 12. An operational amplifier (op-amp) 130 monitors the current drain 108 of the battery section 14. The op-amp 130 generates a voltage signal 132 that corresponds to the current drain signal 108. When the current drain signal 108 is low, the output of op-amp 130 is off. When the current drain signal 108 is high, the output of op-amp 130 is on. The output signal 132 drives a signal generator 134 that generates the RF signal 58 that is transmitted via the antenna 20 to the base station 60.

It should be understood that any combination of the applications above can be included in the electronics provided in the EC battery 12. For example, the device locator function can be combined with the IR-RF function used in an IR remote control device. The base station 60 can also program the MCU 92 (FIG. 10) in any EC battery 12 to provide any one or more of the different operations described above. The EC battery 12 is inserted into the slot 64 shown in FIG. 8. A user would then press one of buttons 66 on the base station 60 that causes the MCU 92 to be programmed to perform one or more of the operations described above. The MCU 92 could alternatively be programmed through RF signals 58 or through a separate physical connection in the base station 60.

The EC battery 12 can also be designed to minimize power consumption from the battery section 14. For example, some applications may require the RF circuitry 18 to continuously send signals 58 to the base station 60 or may require the RF circuitry 18 to continuously monitor signals 58 sent from the base station 60. The MCU 92 (FIG. 10) can be programmed to only periodically turn on the RF circuitry 18. This may require a user to press a locator button 66 on the base station 60 for a longer period of time or it may require the base station 60 to send out a propagation delay detection signal for a longer period of time. However, this has the benefit of substantially reducing the amount of operating power consumed by the electronics in the EC battery 12.

The EC battery 12 enables RF functionality to be inserted into a standard battery slot for battery-powered devices without impacting the device form factor. The RF features can be optionally added to existing electronic products without requiring redesign or burdening the base cost of the product. The EC battery 12 can detect current flow into the battery powered device 50 and in some circumstances allows accessories to infer data about device operation. Battery life can be remotely monitored and the battery can be turned on and off remotely.

Figure 13:
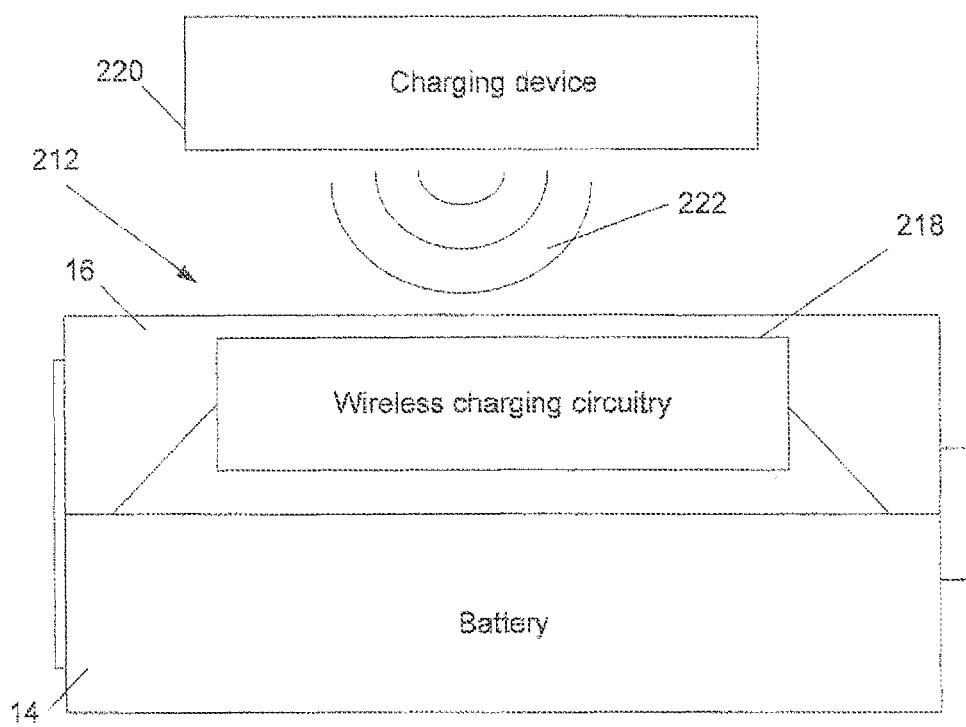
FIG. 13 is an example of an EC battery containing a wireless charging component.

FIG. 13 is an example of an EC battery containing a wireless charging component.

The EC battery 212, like the EC battery shown in FIG. 1, has a standard battery form factor and contains both a battery section 14 holding a Direct Current (DC) battery and an electronics section 16. However, in addition, the EC battery 212 contains wireless charging circuitry 218 configured to wirelessly receive power from a charging device 220 when the EC battery 212 is positioned proximate to the charging device 220. Accordingly, the EC battery 212 allows wireless charging capability to be added to an existing battery operated device without impacting the physical form factor of the existing battery operated device.

For example, many wireless gaming controllers use AAA or AA battery cells and achieve several days of continuous play even when using the lowest power density and lowest cost batteries. It is therefore possible to use less space in a standard battery form factor by using a higher quality battery technology. For example, the EC battery can use a smaller alkaline, Nickel Cadmium (NiCad), or Nickel-Metal Hydride (NiMH) battery technology to provide the same power storage capability as a standard battery in a smaller space. Alternatively, since even marathon gaming sessions typically last less than the several days of capacity, there is scope to reduce the capacity (and thus provide additional space) without falling below the capacity required for any single gaming session. In either case, the additional space made available in the standard battery form factor is then used for the wireless charging circuitry 212. The wireless gaming controller can then be placed proximate to a charging device 220 (such as on a charging mat) to replenish the internal power supply without having to open the battery compartment to replace the batteries or transfer the batteries into another device for recharging.

As another example, consider mobile devices such as cell phones, PDAs, Portable Media Players (PMPs), digital cameras, cordless phones, wireless headsets, etc. Currently, these devices typically do not include wireless charging components integrated therein, and thus generally require physically connecting an adapter thereto for recharging. However, the EC battery 212 can be manufactured to the same form factor as the conventional batteries currently operated in these mobile devices. This allows such mobile devices to be retrofitted with wireless charging capability by replacing the conventional batteries of these mobile devices with the EC battery 212. Thereafter, the mobile device's power source can be replenished without physical connection to any other device, such as by positioning the mobile device proximate to the charging device 220 (such as on a charging mat).

Although the above examples describe wirelessly charging the battery section 14 by positioning the battery operated device having the EC battery 212 inserted therein, it should be understood that the EC battery 212 can also be removed from the battery operated device for wireless charging. In other words, the EC battery 212 could be positioned proximate to the charging device 220 independently of the battery operated device. In some examples, charging in this way can charge the battery section 14 more quickly than charging while still housed in the battery operated device.

It should be appreciated that the term "wireless charging" as used above and throughout refers to charging using energy 222 accessed wirelessly. Such wireless power delivery schemes can include, but are not limited to, inductively coupling a power source to the battery being charged, as well as electromagnetic transmission of power for the purpose of recharging—including RF, optical, infrared, and ultraviolet waves. Another term that can be used to refer to this principle is "contactless charging".

It should be appreciated that the battery section 14 can include any type of battery, e.g. any device that may be used to store and release electrical energy. Examples of batteries include, but are not limited to, capacitors, flywheels, and electro-chemical batteries such as alkaline batteries, lithium batteries, LiMH batteries, Lithium ion, NicCd batteries, LiPo batteries.

It should be appreciated that the charging device 220 can be a standalone device such as a charging mat, or componentry integrated into containers such as, but not limited to, drawers, boxes (whether with a top or open), desk tidies, or a cavity such as within an automobile interior. In any of these cases, the charging device 220 may draw power from an external source including, but not limited to a wall outlet, a remote battery such as a car battery, or its own internal battery. In another example, the charging device 220 could even be a focal point to which electromagnetic energy generated by a transmitter is directed. In such a case, the charging device 220 need not be physically connected to the transmitter.

In one particular example, the charging device 220 is a wireless access point. The wireless access point transmits (for example 2.4 GHz) RF signals both for the purpose of enabling communication over a wireless network, and for the purpose of charging the battery section 14. The wireless access point transmits energy to recharge the wireless battery using spare bandwidth, e.g. time periods during which the wireless network is not transmitting or receiving data. In one example, a first relatively directional antenna may be used to focus a part of the wireless energy towards the wireless charging circuit while a second less relatively omni-directional antenna may be used for wireless data communications with other devices in the wireless network. The battery operated device powered by the EC battery 212 may or may not communicate with the wireless network, but in any case accesses the RF signal using the wireless charging circuitry 218 to power the battery section 14.

It should be appreciated that the shape of the EC battery 212 can correspond to any battery form factor. Examples include, but are not limited to, AA, C, D, AAA, AAAA, or N form factor cylindrical battery cells, coins and button cells such as CR2032, camera batteries, 9V PP3 batteries, and application-specific batteries found in mobile devices such as cell phones, PDAs, Portable Media Players (PMPs), digital cameras, cordless phones, wireless headsets, etc.

Figure 14:
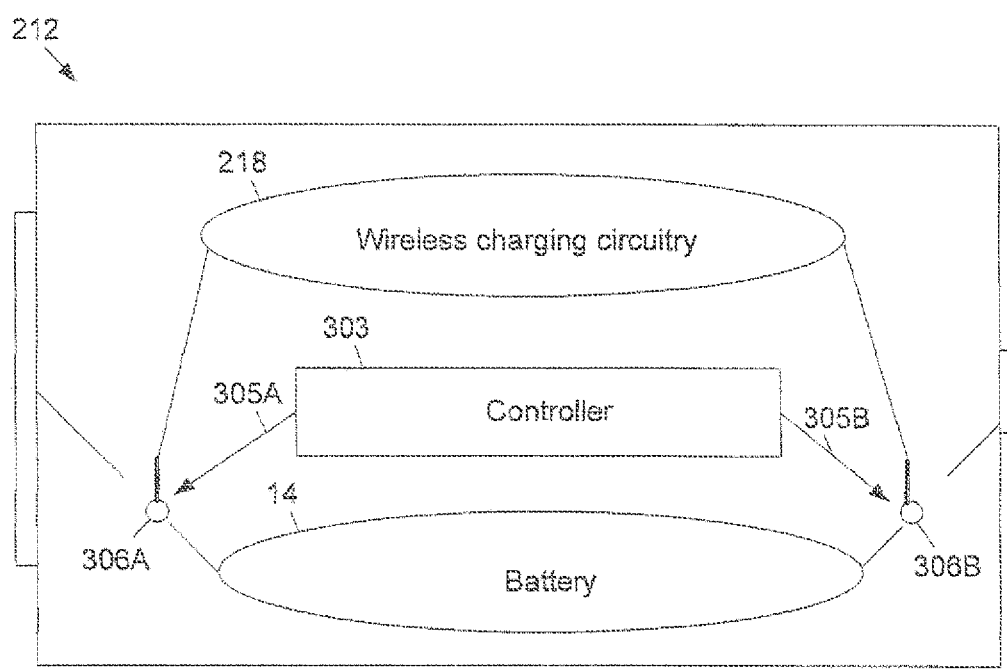
FIG. 14 illustrates circuitry configured to charge the battery section of the EC battery shown in FIG. 13 during periods of inactivity.

FIG. 14 illustrates circuitry configured to charge the battery section of the EC battery shown in FIG. 13 during periods of inactivity.

In some examples, it is possible for the wireless charging circuitry 218 to charge the battery section 14 while the battery section is supplying current to the battery operated device. This scheme can work well in applications where the current provided by the battery section is steady and predictable.

However, to maximize interoperability of the EC battery 212 with a wide variety of battery powered devices, and to operate the EC battery 212 with devices that utilize a wide range of current draw over time, the EC battery 212 can include the controller 303. The general function of the controller 303 is to disconnect the wireless charging circuitry 218 from the battery section 14 when the battery operated device is drawing current from the battery section 14. In one example implementation of the controller 303, the controller 303 sends the signals 305A and 305B to the switches 306A and 306B, respectively.

Figure 15:
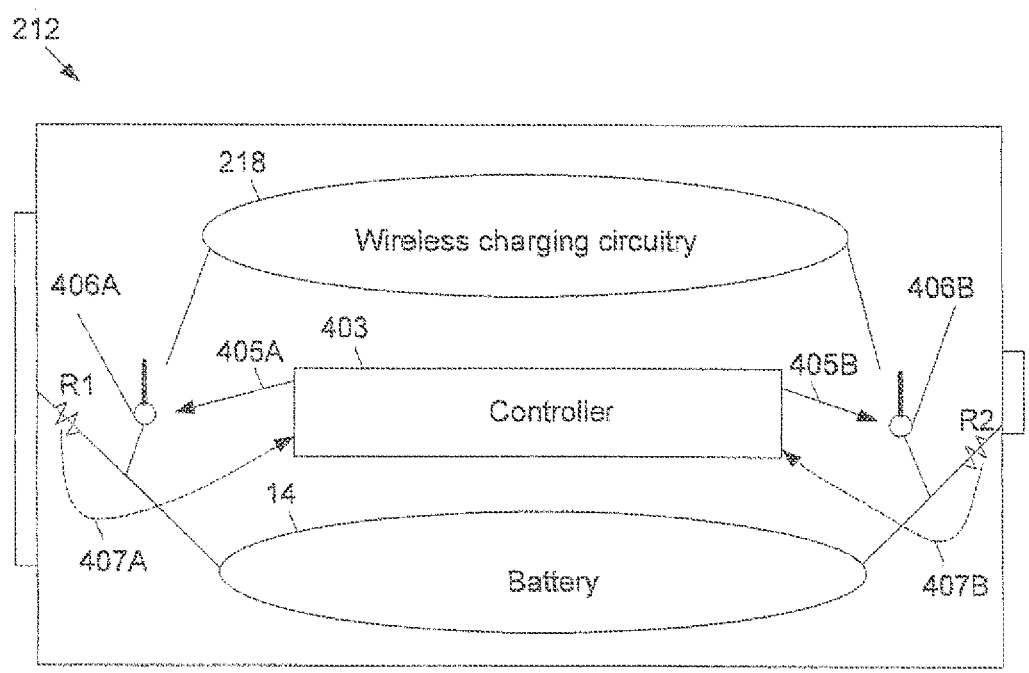
FIG. 15 illustrates circuitry configured to charge the battery section of the EC battery shown in FIG. 13 when the battery section is delivering less than a preset current threshold.

FIG. 15 illustrates circuitry configured to charge the battery section of the EC battery shown in FIG. 13 when the battery section is delivering less than a preset current threshold.

In examples where the battery operated device has at least one mode of operation that utilizes a relatively low current draw (such as a sleep mode or other lower power mode), the wireless charging circuitry 218 can provide current to the battery section 14 while under load. The controller 403 connects the wireless charging circuitry 218 to the battery section 14 when the battery operated device is off or operating in the low power mode. The controller 403 disconnects the wireless charging circuitry 218 from the battery section 14 when the battery powered device operates in a higher powered mode.

In one example implementation of the controller 403, the controller 403 monitors the voltage across one or both of the resistors R1 and R2. If the monitored voltage 407A and/or 407B indicates that the current draw has exceeded a preset current threshold, the controller 403 sends signals 405A and 405B to open the switches 406A and 406B. The preset current threshold is set according to the tolerances of battery operated devices corresponding to the EC battery 212.

Figure 16:
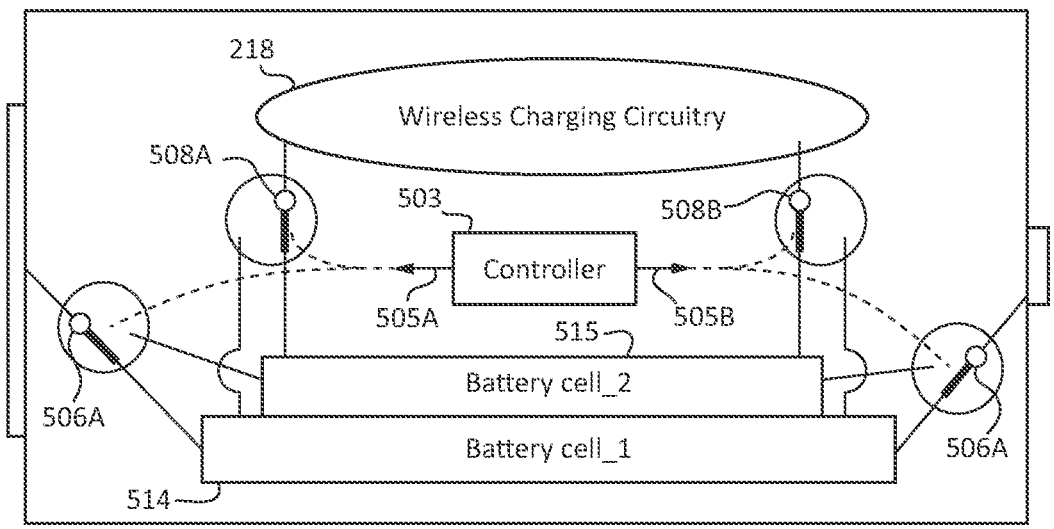
FIG. 16 illustrates circuitry configured to arbitrate charging between different battery cells of the EC battery shown in FIG. 13.

FIG. 16 illustrates circuitry configured to arbitrate charging between different battery cells of the EC battery shown in FIG. 13.

In some applications, it may be particularly helpful to enable operation of the battery operated device while the battery section 14 is being charged by the wireless charging circuitry. An example would be a cell phone positioned on the charging mat while a user utilizes the cell phone in speaker mode.

To provide this feature without risk of damaging the battery operated device, the EC battery 212 can include a plurality of battery cells 514 and 515. These battery cells 514 and 515 are connected in parallel, as opposed to serially connected battery cells such as six and eight cell laptop batteries. The controller 503 causes one of the battery cells 514 and 515 to be charged while a remaining battery cell powers the battery powered device.

In one particular implementation, the controller 503 sends control signals 505A and 505B to control the switches 506A, 508A, 506B, and 508B. The controller 503 can arbitrate which battery cell 514 and 515 is being charged in any fashion, such as charging one of the battery cells 514 and 515 until full and then switching to another battery cell, or alternating between the battery cells 514 and 515 at intervals.

It is noted that the example shown in FIG. 16 connects one of the battery cells to the terminals going to the host device while the other battery cell is connected to the charging circuitry. In other examples, the battery cells can be connected to the terminals in parallel, e.g. simultaneously, particularly when charging is not taking place.

Figure 17:
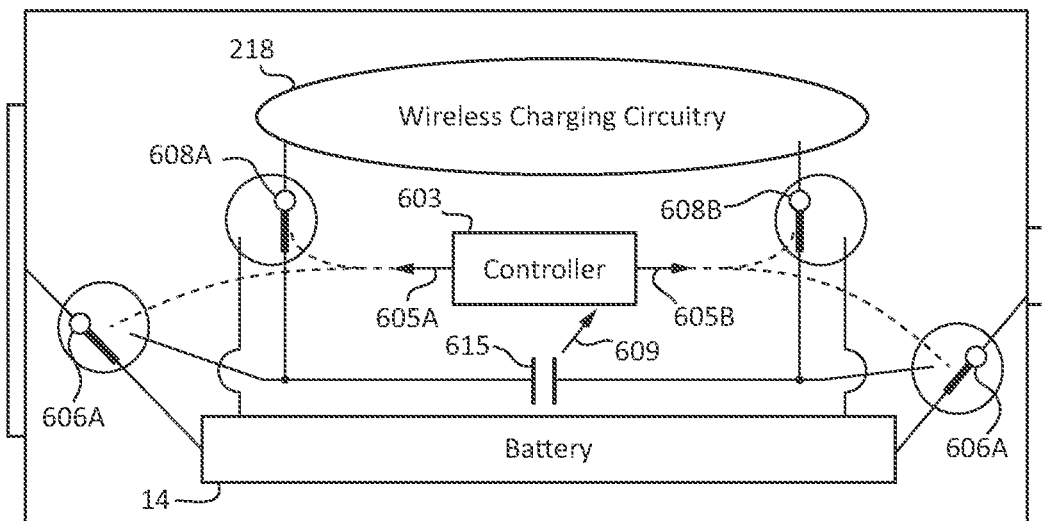
FIG. 17 illustrates auxiliary power circuitry configured to deliver current when charging the battery section of the EC battery shown in FIG. 13.

FIG. 17 illustrates auxiliary power circuitry configured to deliver current when charging the battery section of the EC battery shown in FIG. 13.

In some examples, it may be necessary to provide a small amount of power to the battery operated device while the battery section 14 is being charged. An example is a battery operated device with a clock or a sleep mode, where a small trickle of current is needed to retain data.

Although the parallel battery cells could be used to provide the small amount of power during charging, some applications are particularly cost sensitive. In these applications, a capacitor 615 (or other auxiliary power source besides an additional battery cell) can be used to provide power to the battery operated device while the battery section 14 is being charged by the wireless charging circuitry 218. The controller 603 causes the auxiliary power source 615 to be replenished by the wireless charging circuitry 218 as needed.

In one particular implementation of this feature, the controller 603 sends control signals 605A and 605B to control the switches 606A, 608A, 606B, and 608B. The controller 603 can monitor the voltage 609 across the capacitor 615 to determine times for replenishing the charge stored by the capacitor 615. These times can interrupt charging of the battery section 14 to partially or fully charge the capacitor 615.

Figure 18A:
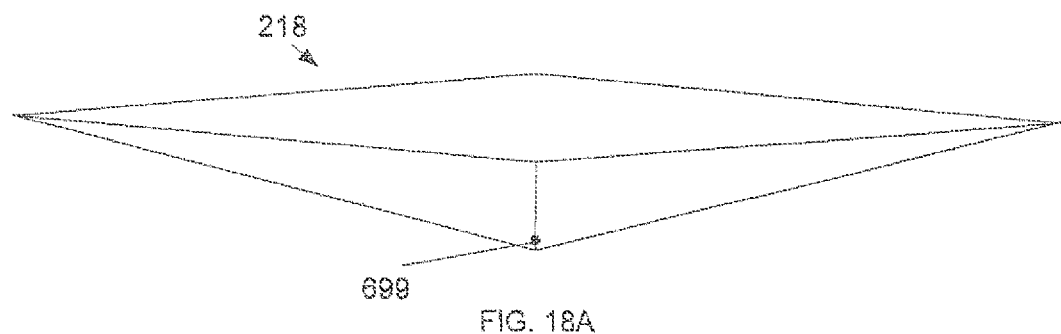
FIGS. 18A-C illustrate different example configurations of the charging device shown in FIG. 13.
Figure 18B:
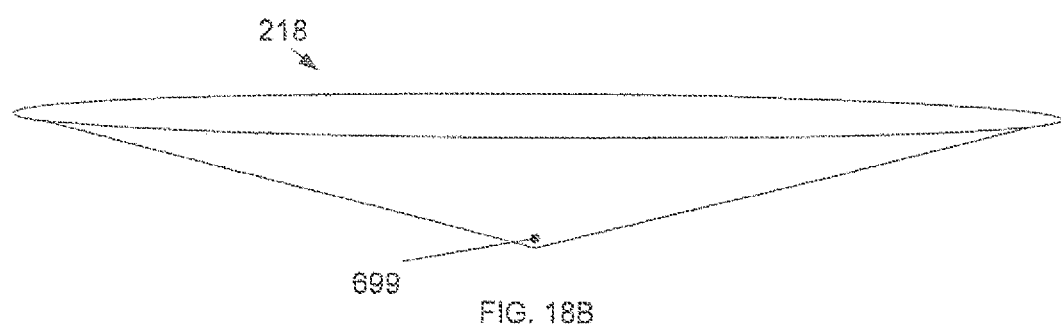
Figure 18C:
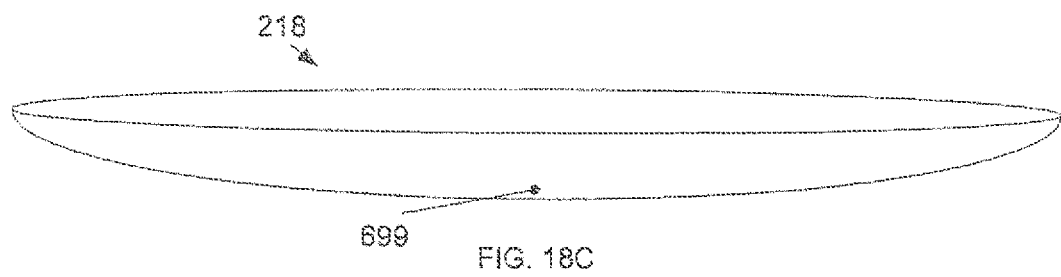

FIGS. 18A-C illustrate different example configurations of the charging device shown in FIG. 13.

As indicated previously, the charging device 218 can be a charging mat in some examples, where the EC battery 212 and a battery operated device containing the EC battery 212 is positioned on the charging mat. The more closely the EC battery 212 is positioned to a charging focus 699 associated with the charging mat, the more efficiently and quickly the EC battery 212 can be charged.

In the example configurations 18A-C, the charging device 218 has a sloped surface, such as a pyramidal design (18A), a cone design (18B), or a bowl design (18C). The charging focus 699 is oriented at a bottommost portion of the sloped surface. The sloped surface causes an EC battery 212 or battery operated device positioned at a distance from the charging focus 699 to slide downward toward the charging focus 699. Accordingly, the EC battery 212 can be charged more efficiently and more quickly.

Figure 19A:
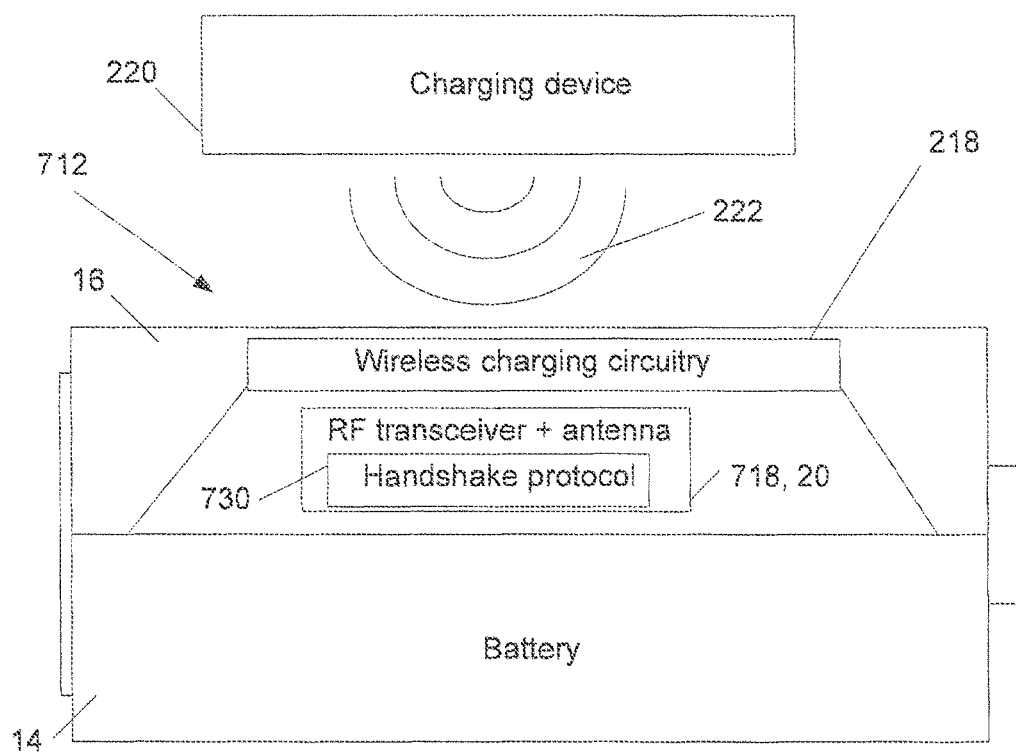
FIG. 19A shows another configuration of the EC battery shown in FIG. 13.

FIG. 19A shows another configuration of the EC battery shown in FIG. 13.

The example EC battery 712 has an electronic section 16 containing the wireless charging circuitry 218 and an additional electronic function, such as the RF transceiver 718 and the antennae 20. It should be appreciated that the additional electronic function is not limited to being an RF transceiver function, but can be any of the electronic functions described previously herein including, but not limited to, RF transmitter, a battery level monitor, a device locator, a remote switch, or a proximity monitor, or any combination thereof (such as an RF transceiver or RF transmitter function and a battery level monitor).

The RF transceiver 718 can be either full duplex or half duplex. The RF transceiver 718 is programmed with a handshake protocol 730, that will be explained in greater detail later with reference to FIG. 19B. The handshake protocol 730 can be distinguished from conventional rudimentary protocols of RF transmitters, which typically follow a "transmit and forget" model.

The RF transceiver 718 can communicate with an IR-to-RF converter in a similar fashion as described previously with respect to FIG. 11 and other figures. The RF transceiver 718 communicates the information obtained via current or voltage sensing to the base station using the handshake protocol 730 (which would be similarly programmed on the base station).

With the handshake protocol 730, the RF transceiver 718 can transmit the IR information in an RF signal to the base station. If the base station receives the RF signal properly, the base station transmits back an acknowledgement. If the RF transceiver 718 does not receive back the acknowledgement in a predetermined period of time, the RF transceiver 718 can automatically retransmit at the same settings or at a varied transmit setting, e.g. changed power gain, changed channel, etc.

If the RF transceiver 718 is half duplex, the protocol 730 causes a switch from transmit mode to receive mode after transmitting an RF signal. This allows the RF transceiver 718 to receive the acknowledgement signal. Similarly, the base station switches from receive mode to transmit mode after receiving the RF signal for transmitting the acknowledgement.

Figure 19B:
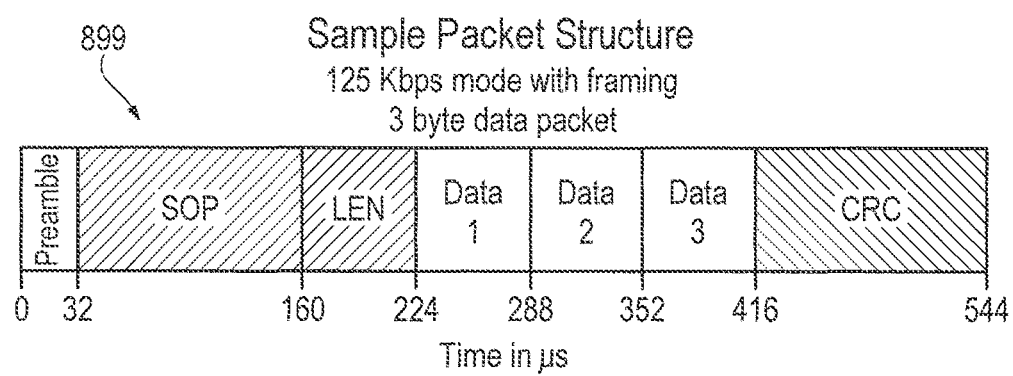
FIG. 19B illustrates the handshake protocol of the EC battery configuration shown in FIG. 19A.

FIG. 19B illustrates the handshake protocol of the EC battery configuration shown in FIG. 19A.

A sample packet structure 899 is illustrated. This sample packet structure 899 is not intended to be limiting; other variations of the handshake protocol 730 can use any packet structure having a header and a payload.

Bits in the header portion of the sample packet structure 899 inform the base station of the meaning of the data in the payload. For instance, they could distinguish between a packet containing IR information and a packet containing other information such as battery level information. Other bits in the header portion can provide status information, such as whether the RF transceiver's 718 receive buffer is full or empty. Other bits in the header portion can be preamble bits, used for tuning the transceiver on the base station to the signals from the RF transceiver 718 from noise in the channel. Additionally or alternatively the header may be used to identify which of several transmitters is the source of the packet, and/or to distinguish between different types of packet—for example between a data packet and an acknowledgment packet.

Error correction information can follow the payload. Such error correction information can be used to determine whether a retransmission is needed.

Other aspects of the example handshake protocol 730 are described in "Wireless USB LP and PRoC LP TRM, Document #001-12603 Rev D", which is herein incorporated by reference in its entirety for all purposes. These aspects are not intended to be limiting; other variations of the handshake protocol 730 can utilize the general principles described above while varying from the specifics described in this document.

Figure 19C:
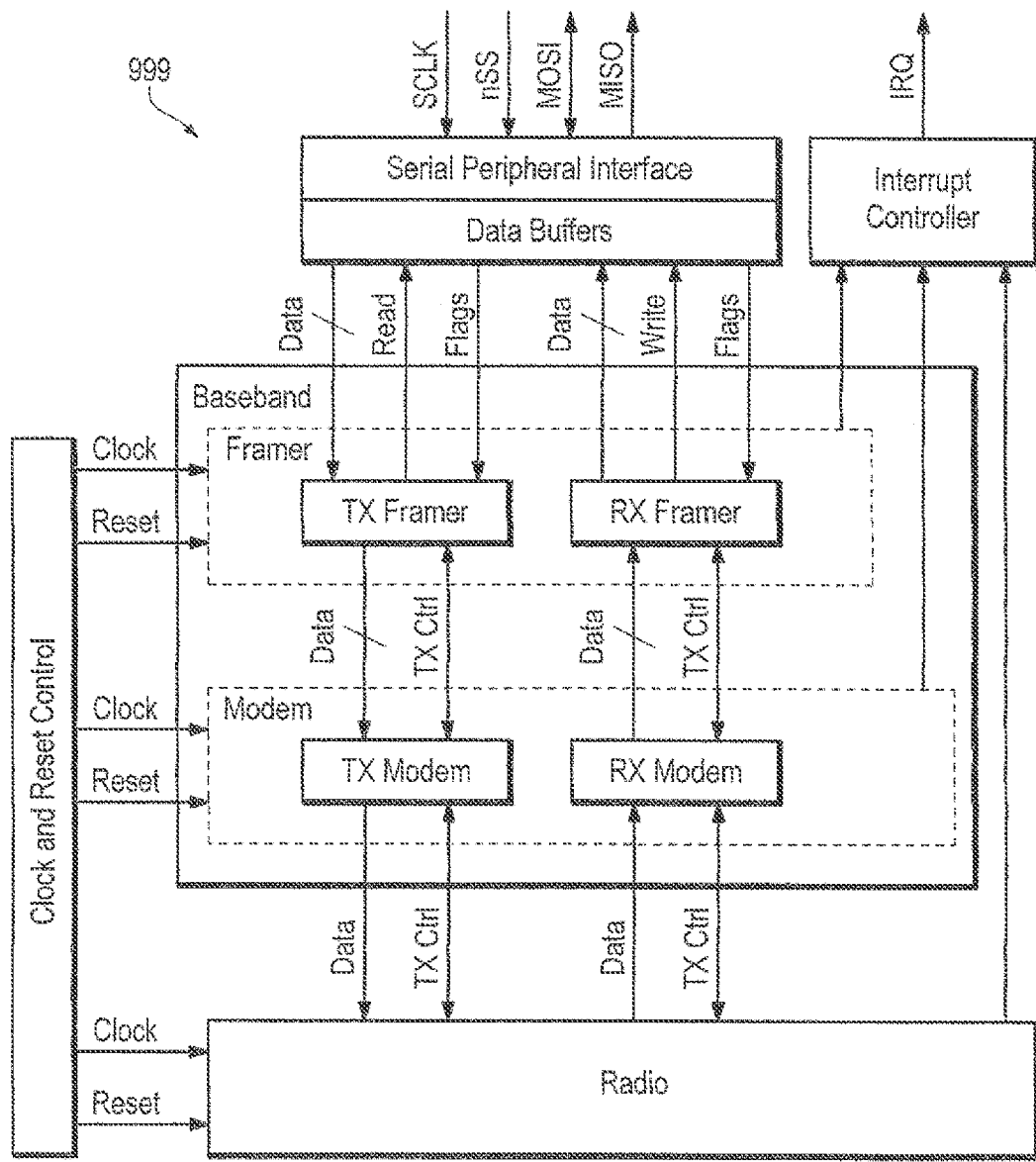
FIG. 19C illustrates a block diagram of the RF transceiver of the EC battery configuration shown in FIG. 19A.

FIG. 19C illustrates a block diagram of the RF transceiver of the EC battery configuration shown in FIG. 19A.

The block diagram 999 illustrates components of the RF transceiver 718. The illustrated modems frame data according to the packet protocol 730, which is then transmitted using the illustrated radio.

Figure 20:
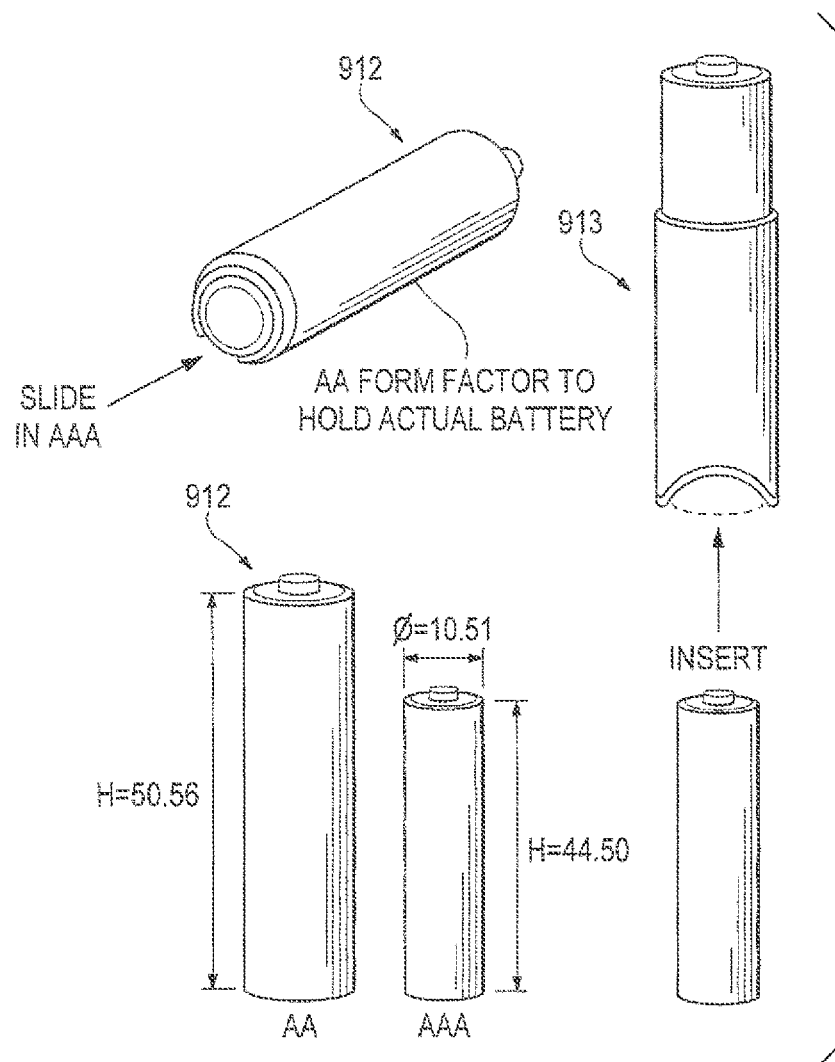
FIG. 20 illustrates an AA form factor EC battery powered by an AAA form factor battery.

FIG. 20 illustrates an AA form factor EC battery powered by an AAA form factor battery.

The EC battery 912 has a shape corresponding to a AA form factor, which allows for insertion into a battery compartment for a AA form factor battery. The EC battery 912 is powered by a conventional AAA battery.

The EC battery 913 has a shape corresponding to a first form factor, which allows for insertion into a battery compartment for a first form factor battery. The EC battery 913 is powered by a battery having a second smaller form factor.

It should be appreciated that reference throughout this specification to "one embodiment" or "an embodiment" means that a particular feature, structure or characteristic described in connection with the embodiment is included in at least one embodiment of the present invention. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the invention.

Similarly, it should be appreciated that in the foregoing description of exemplary embodiments of the invention, various features of the invention are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

The invention claimed is:

1. A battery operated device, comprising:
a battery compartment;
a battery module configured to provide current to the battery operated device through a terminal in the battery compartment;
an electronic module electrically connected to the battery module via a wired connection, the electronic module configured to wirelessly receive energy; and
a controller configured to cause the electronic module to charge the battery module using the wirelessly received energy while a secondary power source discharges current to the battery operated device.

2. The battery operated device of claim 1, wherein the controller is further configured to cause the electronic module to charge the secondary power source while the battery module discharges current to the battery operated device.

3. The battery operated device of claim 1, wherein the secondary power source comprises a battery cell.

4. The battery operated device of claim 1, wherein the secondary power source is an auxiliary power source.

5. The battery operated device of claim 4, wherein the auxiliary power source is further configured to provide a current sufficient to retain data.

6. The battery operated device of claim 4, wherein the auxiliary power source comprises a capacitor.

7. The battery operated device of claim 1, further comprising:
a battery shaped device having a shape that corresponds to a battery form factor, the battery shaped device being insertable into the battery compartment of the battery operated device, the battery shaped device comprising the battery module.

8. The battery operated device of claim 7, wherein the battery shaped device further comprises the electronic module.

9. The battery operated device of claim 8, wherein the battery shaped device further comprises the controller.

10. The battery operated device of claim 9, wherein the battery shaped device further comprises the secondary power source.

11. The battery operated device of claim 2, further comprising:
a battery shaped device having a shape that corresponds to a battery form factor, the battery shaped device being insertable into the battery compartment of the battery operated device, the battery shaped device comprising the battery module.

12. The battery operated device of claim 1, wherein the battery operated device is a mobile device.

13. The battery operated device of claim 12, wherein the mobile device is a cell phone.

14. A device, comprising:
a battery compartment;
a battery module configured to provide current to the device through a terminal in the battery compartment;
an electronic module electrically coupled to the battery module, the electronic module configured to wirelessly receive energy; and
a controller configured to cause the electronic module to charge the battery module using the wirelessly received energy while a secondary power source discharges current to the device.

15. The device of claim 14, wherein the device is a mobile device.

16. The device of claim 15, wherein the mobile device is a cell phone.

17. A device, comprising:
an electrical energy storage compartment;
an electrical energy storage module configured to provide current to the device through a terminal in the electrical energy storage compartment;
an electronic module electrically coupled to the electrical energy storage module, the electronic module configured to wirelessly receive energy; and
a controller configured to cause the electronic module to charge the electrical energy storage module using the wirelessly received energy while a secondary power source discharges current to the device.

18. The device of claim 17, wherein the secondary power source is an auxiliary power source.

19. The device of claim 18, wherein the auxiliary power source is further configured to provide a current sufficient to retain data.

20. The device of claim 18, wherein the auxiliary power source comprises a capacitor.

* * * * *